United States Patent [19]

Paulsen et al.

[11] Patent Number: 4,853,619
[45] Date of Patent: Aug. 1, 1989

[54] DIGITAL PANEL METER

[75] Inventors: Brian Paulsen, Monument Beach; Joseph Vignolo, Dedham, both of Mass.

[73] Assignee: R. T. Engineering Service, Inc., Mansfield, Mass.

[21] Appl. No.: 156,931

[22] Filed: Feb. 17, 1988

[51] Int. Cl.⁴ .................... G01R 19/00; G01R 29/00
[52] U.S. Cl. ................................ 324/115; 324/99 D; 324/114
[58] Field of Search ...................... 324/115, 114, 99 D, 324/123 R, 119; 340/660, 661, 662, 663

[56] References Cited

U.S. PATENT DOCUMENTS

| | | | |
|---|---|---|---|
| 3,979,657 | 9/1976 | Yorksie | 340/661 X |
| 4,000,463 | 12/1976 | Katzmann et al. | 324/115 X |
| 4,115,733 | 9/1978 | Silberberg | 324/99 D |
| 4,157,501 | 6/1979 | Cain, Jr. et al. | 324/115 X |
| 4,251,769 | 2/1981 | Ewert et al. | 340/661 X |
| 4,321,530 | 3/1982 | Kelly et al. | 324/115 X |
| 4,422,039 | 12/1983 | Davis | 324/119 X |
| 4,641,090 | 2/1987 | Danby | 324/115 X |
| 4,748,404 | 5/1988 | Heinze et al. | 324/115 X |

FOREIGN PATENT DOCUMENTS 2055480 3/1981 United Kingdom ................ 324/115

OTHER PUBLICATIONS

"New Concept Hioki Digital Multimeters"; Cat No. 3207 E; 1980; pp. 1–4.

Primary Examiner—Reinhard J. Eisenzopf
Assistant Examiner—Vinh P. Nguyen
Attorney, Agent, or Firm—Wolf, Greenfield & Sacks

[57] ABSTRACT

A digital panel meter adapted for replacement of a standard analog panel meter and designed to selectively receive different ranges of input signals such as AC or DC input signals. The meter circuitry employs an analog-to-digital converter having multiple digits, an input circuit including a range circuit, an operational amplifier and filter circuitry. A relay is tripped for signaling the attaining of a trip point. An audible alarm is provided that may be enabled or disabled and that may be operated in either continuous or short term modes.

15 Claims, 6 Drawing Sheets

RUN MODE

TRIP POINT SET MODE

TO PROGRAM AUDIBLE ALARM
USE SWITCH POSITIONS 3 AND 4

CONTINUOUS AUDIBLE ALARM AT AND ABOVE TRIP POINT

30 SECOND AUDIBLE ALARM AT AND ABOVE TRIP POINT

"SILENCE" NO AUDIBLE ALARM

TO PROGRAM TRIP POINT
USE SWITCH POSITIONS 1 AND 2

RUN MODE

TRIP POINT SET MODE

TO PROGRAM AUDIBLE ALARM
USE SWITCH POSITIONS 3 AND 4

CONTINUOUS AUDIBLE ALARM AT AND ABOVE TRIP POINT

30 SECOND AUDIBLE ALARM AT AND ABOVE TRIP POINT

"SILENCE" NO AUDIBLE ALARM

DIGITAL PANEL METER

BACKGROUND OF THE INVENTION

The present invention relates in general to meters and it is concerned, more particularly, with a digital panel meter that is primarily adapted as a replacement meter for a standard analog panel meter. Even more particularly, the present invention relates to a digital panel meter having an associated alarm relay.

Reference is now made to U.S. Pat. No. 4,157,501 on a digital panel meter owned by the present assignee herein. This prior patent describes a digital panel meter including an input range circuit employing jumpers for selecting different amplitude ranges. Although the digital panel meter described in this patent is more than adequate for its intended usage, it does not provide any external signaling upon attaining a trip point.

Accordingly, it is an object of the present invention to provide an improved digital panel meter and one which in particular has means for providing an output signal indicating the attaining of a particular trip point usually set by the user of the meter.

A further object of the present invention is to provide a digital panel meter that is easy to install and calibrate even by a non-technical person.

Another object of the present invention is to provide a digital panel meter that is relatively compact and that permits a decimal point setting by switch means.

Another object of the present invention is to provide an improved digital panel meter that has an audio signal circuit for providing an audio signal in response to attaining the trip point.

Another object of the present invention is to provide an improved digital panel meter as in accordance with the preceeding object and in which the audio signal may be enabled or inhibited, and in which the audio signal may also be selected to be of continuing or short duration.

SUMMARY OF THE INVENTION

To accomplish the foregoing and other object, features and advantages of the present invention, there is provided a digital panel meter which is comprised of a housing for mounting the majority of components comprising the meter circuitry. Preferably, a terminal strip is mounted at the rear of the housing including input terminal means for receiving signals to be measured. The circuitry of the panel meter of this invention includes a range circuit that preferably has a jumper means for selecting one of a plurality of different amplitude ranges. The jumper means is easily accessible at the rear of the meter being connectible between different terminals on the terminal strip. Another connection to the terminal strip is an input AC power connection which couples to a power supply for the meter which provides a regulated output voltage. The meter circuitry also comprises amplifier means, filter means and an analog to-digital converter means. The amplifier means is preferably an operational amplifier having an input coupling from the range circuitry and having its output coupled by way of filter means to the analog-to-digital converter.

In accordance with the invention, the meter circuitry also includes a comparator having a preset input, that is preset by the meter user. This may be preset at a particular trip point. The output of the comparator couples to a relay for providing an output signal from the meter that can be used with utilization apparatus. The meter circuitry also includes an audible alarm. The audible alarm is controlled from a switch means that may be used to either enable o disable the audible alarm. There is also provided a second switch means for selecting different modes of operation including a continuous mode and a short term mode. Both of these switch means are operable by the meter user. A plurality of operating switches are also provided associated with the input terminal means and for enabling selection of a decimal point position.

BRIEF DESCRIPTION OF THE DRAWINGS

Numerous other objects, features and advantages of the invention should now become apparent on a reading of the following detailed description taken in conjunction with the accompanying drawings, in which.

DETAILED DESCRIPTION

FIGS. 1A-1D illustrate a schematic diagram of the meter's circuity.

Figure 1A:
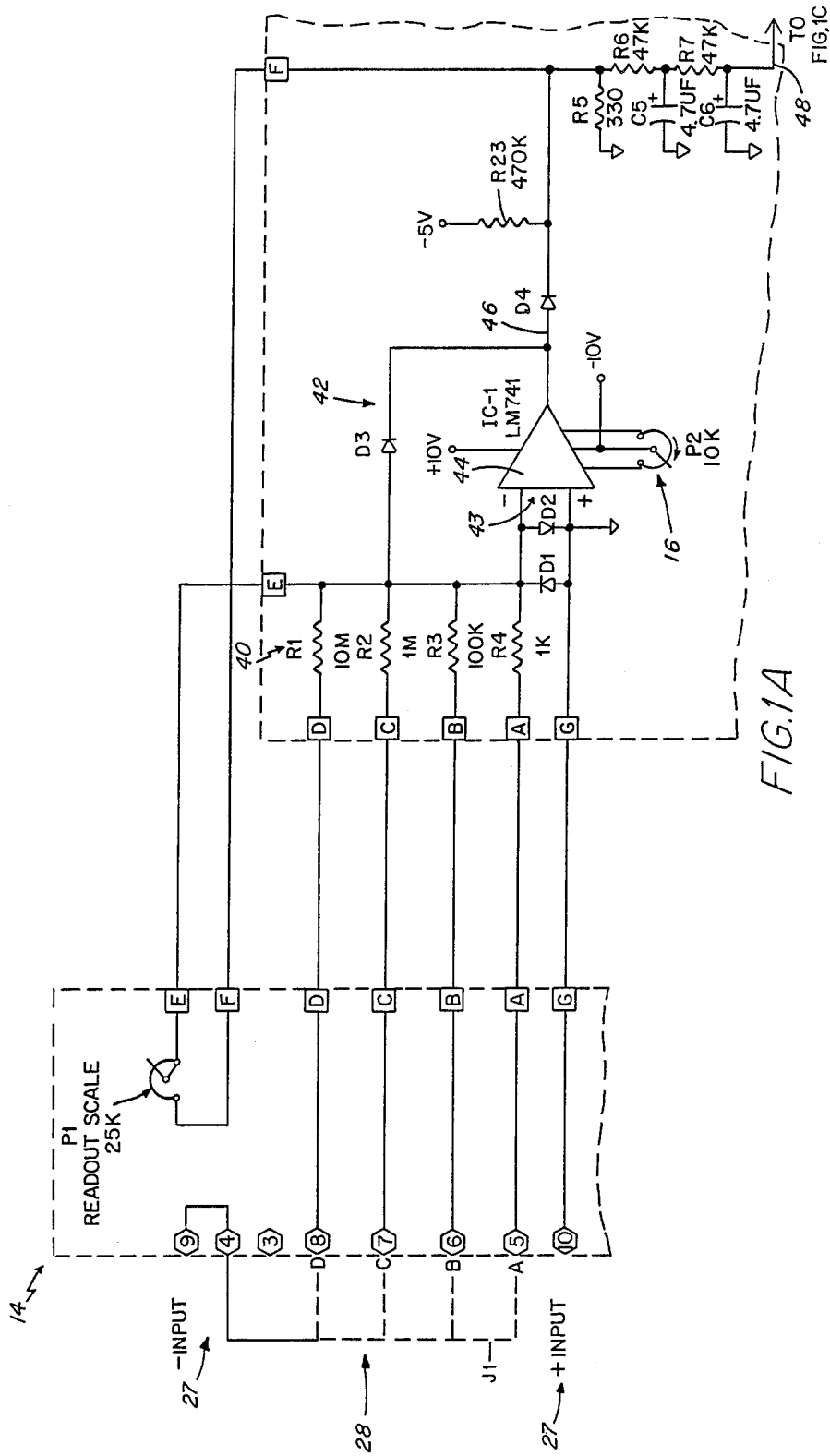
FIGS. 1A-1D illustrate an overall circuit diagram for the meter circuitry of the present invention.
Figure 1B:
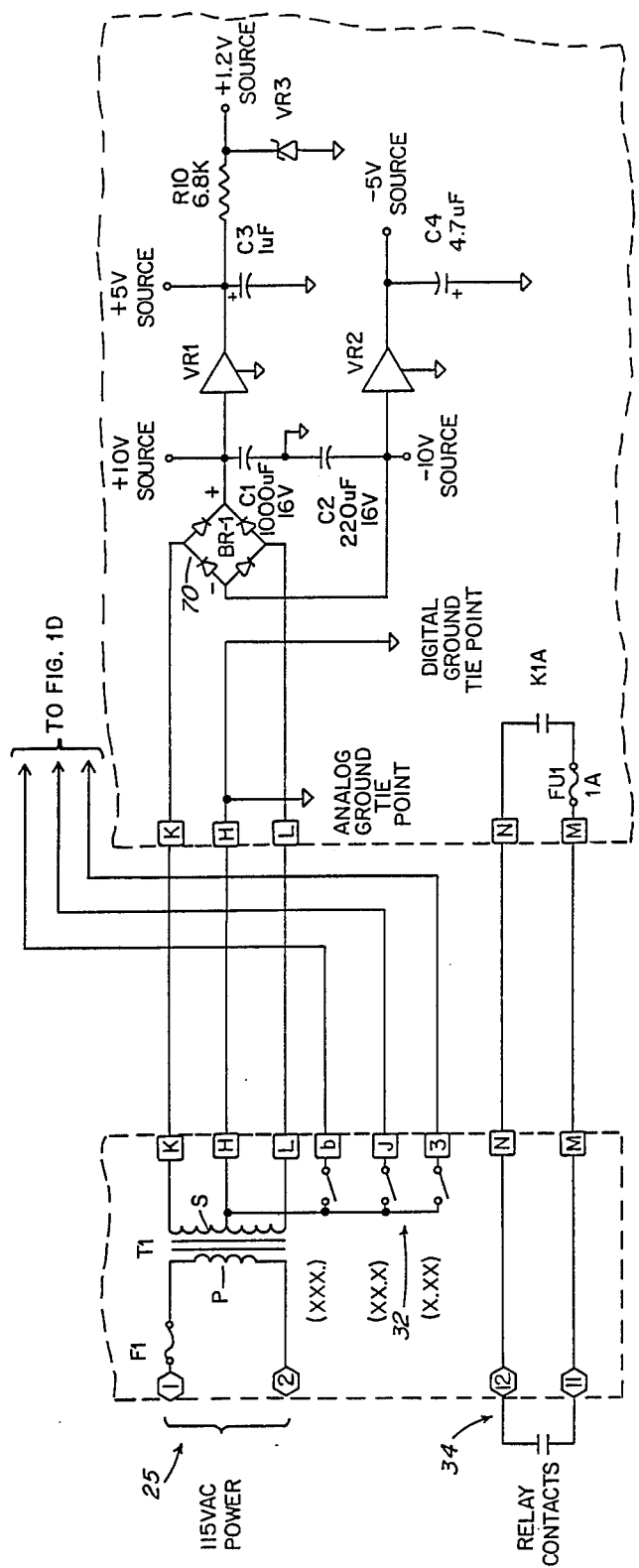
Figure 1C:
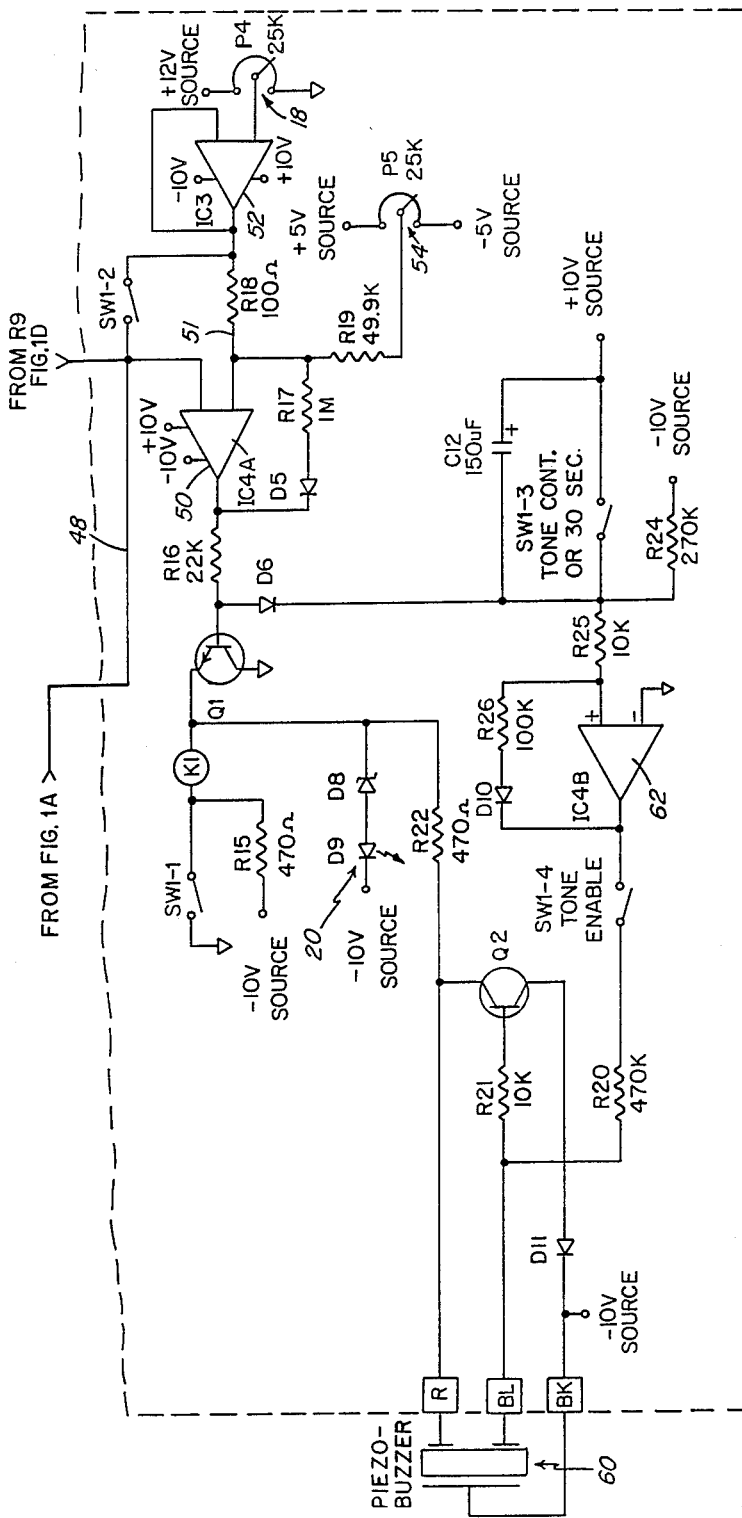
Figure 1D:
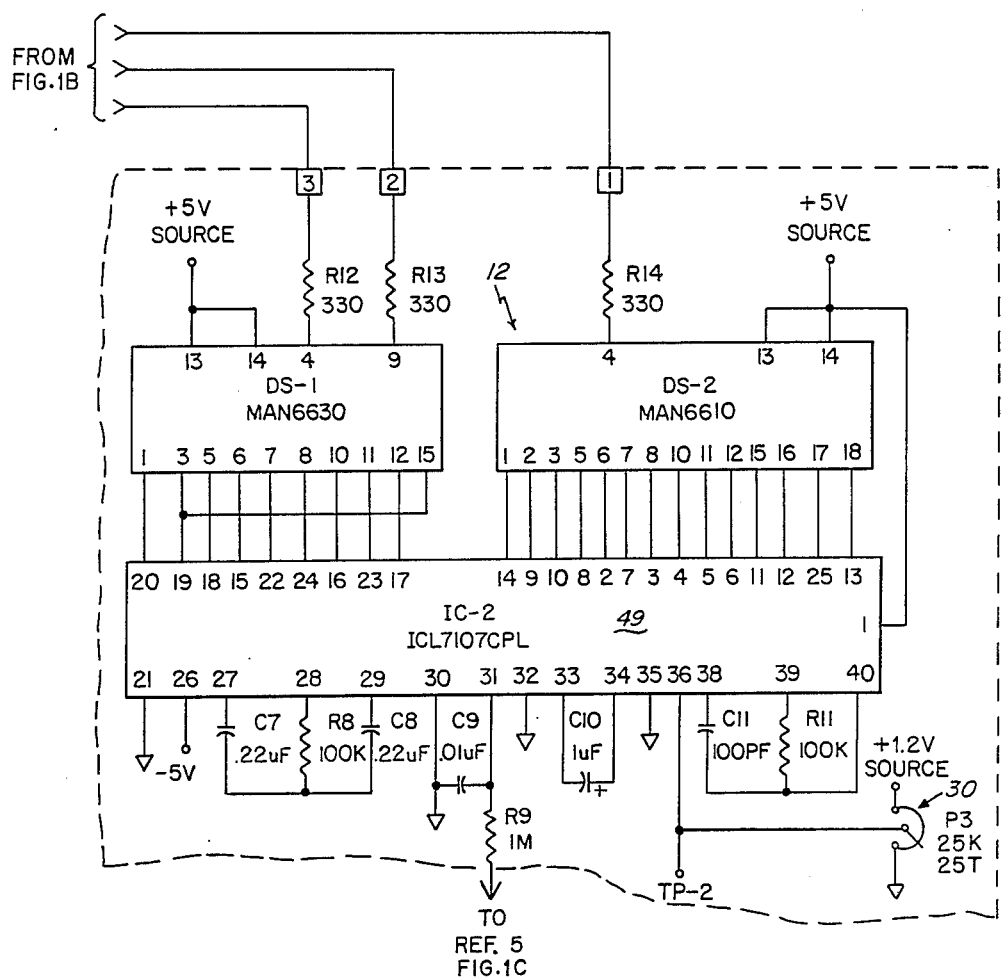
Figure 2:
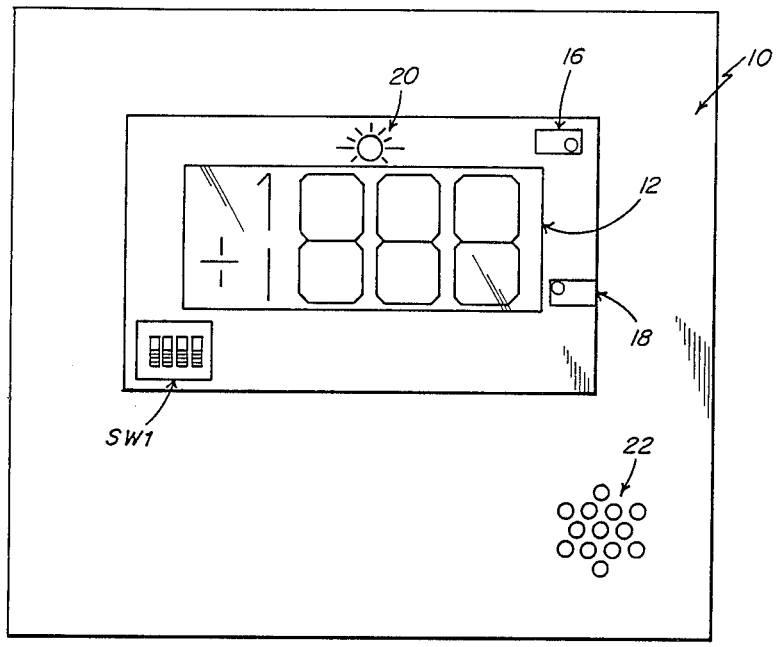
FIG. 2 is the front view of the digital panel meter of this invention.
Figure 2:
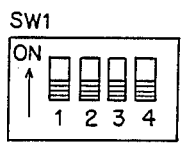
Figure 2:
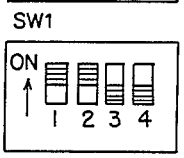
Figure 2:
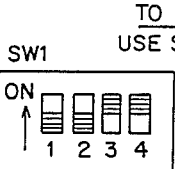
Figure 2:
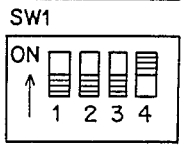
Figure 2:
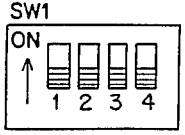
Figure 3:
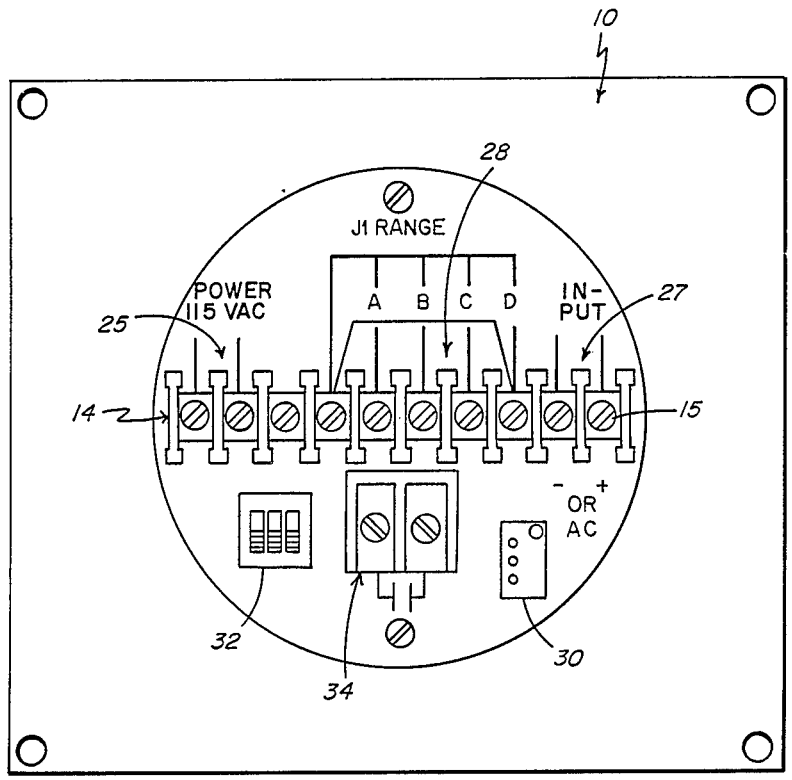
FIG. 3 is a rear elevation view of the meter illustrated if FIG. 2.

FIG. 2 illustrates a front view of the meter and FIG. 3 a rear view of the meter.

As illustrated in FIG. 2, the meter comprises a housing 10 which may be constructed of either steel or a plastic material and which may be provided in two separate parts. In the front view of FIG. 2 there is shown the display 12 which is a four digit display viewable at the front of the housing 10. The housing 10 may also have therein a printed circuit board or the like for mounting electronic components such as at least some of the components shown in FIGS. 1A-1D.

The meter of this invention may be inserted in a panel such as an instrument control panel and for the purpose of mounting the meter there is provide series of mounting screws that may be disposed at each corner of the housing. FIG. 3 shows at the corners of the housing the holes for the mounting screws.

In connection with FIG. 2 and the front of the meter, in addition to the display at 12, there is also provide a trip point and audible alarm programming switch SW1, a zero set adjust 16, a trip point adjust 18, a flashing LED indicator 20, and porting means 22 for the audible alarm. Many of the items illustrated in FIG. 2 will be refered to hereinafter in connection with the description of the meter circuitry in FIGS. 1A-1D. FIG. 2 also illustrates the different settings for the switch array of switch SW1 for both programming the trip point as well as programming of the audible alarm type.

FIG. 3 shows the rear of the meter housing including the terminal strip 14 compised of a series of electrically isolated terminals 15. The input AC power is coupled at input AC terminals 25. The input signal to be measured is coupled at the input terminals 27. The terminals illustrated at 28 are for accommodating a scaling jumper with four separate possible positions as illustrated in FIG. 3 by respective positions A, B, C and D. These relate to corresponding similar positions illustrated in the meter circuitry to be described hereinafter.

FIG. 3 also illustrates a calibration potentiometer 30 and the decimal point placement switch 32. Disposed under the terminal strip 14 are the solid state switching terminals 34. These terminals may be connected to some type of a utilization device that senses the state of the meter. Generally speaking, there is either a short across these terminals to signal an external device that a trip point has been reached. When there is an open across these terminals this indicates that the trip point has not yet been reached. Further discussion follows regarding the items in FIG. 3 in connection with the circuit diagram of FIGS. 1A-1D.

The panel meter of this invention is a versatile instrument and is designed to fit in the same mounting cutouts as a standard 4½ inch analog meter, yet it will accept a wide range of voltage inputs from a wide variety of input signal devices. The unit can be very simply calibrated via a 25 turn potentiometer at the rear of the housing, namely potentiometer 30 illustrated in FIG. 3. Basically, the meter can be calibrated to read any 3½ digit parameter required from 0.000 to 1999 with user selectable decimal points at three locations. In this regard note the decimal point switch 32.

With regard to the switch 32 it is noted that in past units it has been typical to provide jumpers for decimal point selection. However, with meter circuitry of the type described herein, it is common to have some relatively large voltages that may be present. In this regard it is noted that in the meter circuitry the switch 32 couples to the primary of transformer T1 and it has been found that there are common mode voltages that can present some danger in connection with the use of jumpers for decimal point selection. Accordingly, in accordance with the present invention a decimal point selection switch has been used as illustrated.

The meter of the present invention differs in a number of ways from the digital meter described in U.S. Pat. No. 4,157,501. For one thing, this meter now has an internal relay for providing, for example, an alarm to a user when a measured parameter exceeds a predetermined value. This relay is illustrated in the meter circuitry as relay K1 having associated contacts illustrated at K1A. The level at which the relay contacts are set to close, is easily set via a ten turn potentiometer disposed underneath the display. This is the potentiometer 18 in Fig. 2. Once set the relay contact will close when the display value becomes greater than or equal to the value which was set. A LED 20 blinks on and off and is visible through the display bezel. If desired, an audible alarm can be made to sound when the contacts become closed. A further option is that the audible alarm can be made to silence itself after 30 seconds or can be continuous. This is controlled from various contacts of the switch array SW1.

The following is a listing of certain specifications pertaining to the meter.

| | |
|---|---|
| Input Ranges | (A) 50 Millivolts DC (100 Millivolts AC) |
| | (B) 5 VDC (10 VAC) |
| | (C) 50 VDC (100 VAC) |
| | (D) 500 VDC (480 VAC) |
| Maximum Input & Overvoltage | 1000% of range or 500 VDC (480 VAC) whichever is less |
| Accuracy | 0.5% linear +1 digit F.S. |
| Input Resistance at Nominal Scale Values | 20K Ohms/Volt D.C. 9K Ohms/Volt A.C. |
| A.C. Voltage Measurements | |
| Maximum Signal Frequency | 2KHz |
| Minimum Input Frequency | 40Hz - extends down to 1 Hz for readings of 010 or below (A.C. Tachometers |
| Sampling Time | 3 Readings/Second Update |
| Response (000 to 1999) | 6.5 Seconds |
| Relay Contacts | |
| Type | Internally Fused N.O. Solid State Triac |
| Rating | 115VAC 50/60Hz, .5 Amps (500 Milliamps) |
| Trip Level Repeatability | 0.1% of Full Scale (±1 Digit) |
| Power Requirement | 115VAC Nominal (+10V), 50/60Hz, 2 Watts, (230VAC, 50/60 Hz Optional) |
| Operating Temperature | 5 C. to 50 C. |
| Typical Signal Inputs | A.C. or D.C. Signals from : Line Voltage, Reference Voltage Tachometers, Force Transducers (Load Cells), Shunt, Current Transformers, Pressure & Flow Transducers |
| Display | 3½ Active Digit (0-1999). 0.5 Inch LED Non-blinking. Optional decimal points at the following positions: 1.8.8.8 (user selectable) |
| Overrange | Indication by a "1" in the most significant position with remaining display unlit. |
| Weight | 1 Pound |

As indicated above, the meter of this invention can accept either AC or DC input signals at the terminals 27. These signals are coupled by way of a scaling (range) network 40 and a variable gain half-wave rectifier circuit 42. The inputs at the terminals 27 and 28 may be either AC or DC or a constant area pulse train with ranges as previously indicated. The input impedances for each range are represented by the resistors R1-R4 of respective values 10 meg ohms, 1 meg ohm, 100 k ohm and 1 k ohm. Of course only one of the resistors R1-R4 are selected at a time by means of the jumper J1, to couple the input signal to input 43 of the operational amplifier 44.

The operational amplifier 44 is preferably a conventional operational amplifier as a type LM 741 having an offset null controlled by potentiometer 16, a pair of input terminals at 43, and an output terminal 46. Also illustrated in this circuitry are a pair of oppositely arranged diodes D1 and D2 which limit the voltage difference at the input terminals of the amplifier, both in a positive and negative sense. The diode D3, which is coupled across the operational amplifier 44 is preventing excessive slew times and AC non-linearities by limiting the negative output of the amplifier 44 to about −0.6 volts which occurs during the negative half cycles when considering AC operation.

For AC or pulsed modes of operation the output at the cathode of diode D4 is a half-wave rectified signal having the usual sinusoidal positive portion of the signal and a clipped negative portion which is clipped at approximately 0.6 volts. Thus, the operational amplifier 44 actually forms an inversion with any negative signals at its input appearing as a positive voltage level at the output of the amplifier.

The output from the rectifier couples to a filter circuit which is preferably a compound smoothing filter comprised of resistors R5–R7 along with capacitors C5 and C6 connected as a ladder network. In one embodiment the roll-off of this filter may be approximately 40dB/decade above 0.7 Hz.

The output signal from the filter couples by way of line 48 to the input of the analog-to-digital converter 49. The signal along line 48 also couples to the comparator 50. The analog-to-digital converter 49 may be of type ICL 7107 CPL. The comparator 50 may be of the type IC 4 A. Associated with analog-to-digital converter 49 are the display devices 12. This provides the display as illustrated in FIG. 2. The display devices may be of type MAN 663 and MAN 6610 as illustrated. It is also noted that the three separate decimal point select switches of switch array 32 couple to appropriate inputs of the display 12 so as to provide proper decimal point selection, as desired by the user.

Thus, the basic input signal couples to one of the inputs of comparator 50 while the other input of the comparator at line 51 is a reference input. This is coupled from operational amplifier 52 which in turn is adjusted by means of the trip-point adjustment potentiometer 18. There is also a second factory set potentiometer 54 illustrated in the meter circuitry and this also couples to the input line 51 of the comparator 50. It is also noted that at the input to the comparator 50 there is provided the switch contact SW1-2. In its open position the contact SW1-2 has no effect on the circuit but when it is closed this switch contact couples with the trip-point adjustment circuitry directly to the display for setting the trip-point level. This would be in the trip-point set mode as illustrated in FIG. 2. In that mode the switch contact SW1-2 is also closed to prevent the relay K1 from triggering by essentially grounding both sides of the relay. Note that one side of contact of SW1-1 is coupled to ground.

When the comparator 50 is at its non tripped state, the output therefrom is at a more negative voltage level maintaining the transistor Q1 non-conductive. When the comparator 50 does trip then the transistor Q1 conducts and energizes the relay K1 through the resistor R15. When the transistor Q1 conducts this also energizes the flashing LED 20 by way of the Zener diode D8. When the relay K1 energizes the associated contact K1A is energized to provide an indication at the output terminals 34 usable at another utilization device as determined by the user of the product.

When the relay K1 energizes, there is also a driving voltage coupled by wa of the resistor R22 to the piezo-buzzer 60 to provide an alarm. Associated with the buzzer 60 is an oscillating transistor Q2, diode D11 and associated resistor R20 and R21. The piezo-buzzer 60 is arranged to provide a continuous audible signal under control of the oscillating transistor Q2. The transistor Q2 is enabled from the output of the operational amplifier 62. The circuitry also depicts the switch contact SW1-4 which is a tone enable contact. In its open position there is no signal coupled to the transistor Q2 and thus the audible tone is disabled. This is also illustrated in FIG. 2 as a "silence condition". The operational amplifier 62 is operated by way of diode 6 and resistor R25 essentially from the output of comparator 50. There is also provided in the circuitry the other switch contact SW1-3 that controls whether the audible tone is to be continuous or only over some previously determined interval set up in this circuit as being for a thirty second interval. If the switch is closed then the capacitor C12 is essentially short circuited and this would be for a continuous tone. When the switch SW1-3 is opened then a charging of the capacitor C12 occurs and there is a time-out for controlling the enable signal coupled to the transistor Q2.

As far as the AC input is concerned at terminals 25, this is a conventional AC input voltage coupled by the way of fuse F1 to the primary winding P of transformer T1. The secondary winding S of transformer T1 has a grounded center tap and has its other two connections coupled to a full wave rectifier bridge 70. There are a pair of capacitors C1 and C2 associated with the output of the bridge circuit 70. The voltage across these capacitors is an unregulated voltage that can be used, for example, for the operational amplifier 44. The output of the bridge circuit 70 also couples to regulators VR1 and VR2. On one side the circuit includes capacitor C3, resistor R10 and Zener diode VR3. On the other side there is simply the compacitor C4. These provide respective voltages plus 1.2 volts and −5 volts. These voltages may be used for example, at the analog-to-digital converter 49.

In using the meter of this invention the standard 115 AC is coupled at the terminals 25. The meter is internally fused as indicated. The signal terminals are connected to the input terminals at 27. If the signal is a DC signal, the polarity should be correct. Low voltage signals, or signals relating to a reference or feedback for a device system are to be run in a shielded cable to minimize any noise pickup from the cable run. The shield should be connected to the meter common. The other end of the shield is to remain unconnected and insulated using electrical tape.

As far as the range circuit is concerned, if the maximum voltage of the signal is not known, one can fasten the jumper J1 to the highest range, namely terminal D. One then applies the maximum signal and adjusts the "read-out scale" adjustment 30 at the rear of the meter, until the desired display reading is obtained. If the meter display cannot be adjusted to read high enough, the signal input is removed. The jumper is then unfastened and placed on the lower range namely terminal C. The signal is reapplied and again the adjustment is made to obtain the desired display reading. This continues until the proper range has been obtained.

As far as setting the meter relay is concerned, this adjustment is made only after the meter has been calibrated. The switch contacts SW1 and SW2 are moved to their "on" position. A trip light comes on. Using a small screwdriver one can make an adjustment until the display reads the number desired for tripping the meter. The switch contacts SW1 and SW2 are then moved to their "off" position or "open" position. The meter is now ready to operate.

When the display reads the number or higher than the number set, the relay contacts close. The red trip light goes on and blinks, this is the LED 20, to show that the meter has tripped. The contacts remain closed until the display value again becomes less than the number set.

As far as the audible alarm is concerned, if the switch contact SW1-4 is on an audible alarm sounds as the meter goes above the set or trip point. If the switch contact SW1-3 is on the alarm remains on as long as the meter stays above the set point. However if the switch contact SW1-3 is off then the meter automatically silences itself after 30 seconds.

Having now described a limited number of embodiments of the present invention, it should now be apparent to those skilled in the art that numerous other embodiments and modifications thereof are contemplated as falling within the scope of the present as defined by the appended claims.

What is claimed is:

1. A digital panel meter comprising;
   a housing,
   input terminals means for receiving AC and DC input signals,
   range circuit means including means responsive to the output of the input terminal means and means for selecting one of a plurality of different amplitude ranges,
   amplifier means responsive to the output of the range circuit means and having an output,
   a rectifier means responsive to the output of the amplifier means,
   filter means responsive to the output of the rectifier means,
   analog-to-digital converter means responsive to the filter means,
   display means mounted in the housing and coupled from said analog-to-digital converter means,
   a terminal strip at the rear of the housing including terminals forming the input terminal means and AC power terminals,
   a comparator means responsive to the output of the filter means, means for establishing an adjustable reference input to the comparator means for establishing a trip-point,
   relay means coupled from the output of said comparator means and adapted to be set when the comparator means triggers, and
   a plurality of separately operable decimal point setting switches coupled to said display means for manual setting of the decimal point in the display means.

2. A digital panel meter as set forth is claim 1 wherein said amplifier means includes an operational amplifier and said rectifier means includes a diode.

3. A digital panel meter as set forth in claim 2 wherein said range circuit means includes a plurality of different value scaling resistors each coupling to a signal input of the operational amplifier.

4. A digital panel meter as set forth in claim 3 wherein said means for selecting includes a jumper selectively coupled to only one of said scaling resistors.

5. A digital panel meter as set forth in claim 4 including a pair of oppositely poled diodes across the input of the operational amplifier.

6. A digital panel meter as set forth in claim 5 wherein said filter means includes a resistor-capacitor ladder network.

7. A digital panel meter as set forth in claim 6 including a scale potentiometer across the operational amplifier for calibration purposes of the display.

8. A digital panel meter as set forth in claim 1 including a diode connected between the input and output of the amplifier means.

9. A digital panel meter as set forth in claim 1 wherein said range circuit means include a plurality of different value scaling resistors, said means for selecting including a jumper selectively coupled to one of said scaling resistors, said terminal strip including terminals for said jumper.

10. A digital panel meter as set forth in claim 1 including means for providing an audible alarm in response to the setting of said relay.

11. A digital panel meter as set forth in claim 10 including first switch means for enabling said audible alarm.

12. A digital panel meter as set forth in claim 11 including a second switch means for selecting between either continuous alarm or an alarm of predetermined short duration.

13. A digital panel meter as set forth in claim 1 including a first switch associated with said comparator means and means for adjusting the trip-point, said switch providing for direct coupling of the set-point adjustment to the display means.

14. A digital panel meter as set forth in claim 13 including a second switch for disabling the relay when the first switch is used to set the trip-point.

15. A digital panel meter comprising:
    a housing;
    a terminal strip associated with the housing and including input terminal means;
    range circuit means including means coupled from the input terminal means and means for selecting one of a plurality of different amplitude ranges;
    detection circuit means including amplifier means coupled from said range circuit means and having a detection circuit means output;
    analog-to-digital converter means coupled from said detection circuit means;
    display means mounted in the housing and coupled from said analog-to-digital converter means;
    a comparator means responsive to the output of said detection circuit means, and means for establishing an adjustable reference input to the comparator means for establishing a trip-point;
    means coupled from the output of said comparator means and adapted to be set when the comparator means triggers;
    decimal point setting switch means coupled to said display means and including means for manually setting one of a plurality of different settings of the decimal point in the display means.

* * * * *